United States Patent
Choe (10) Patent No.: US 6,744,283 B2
(45) Date of Patent: Jun. 1, 2004

(54) CLOCKED HALF-RAIL DIFFERENTIAL LOGIC WITH SENSE AMPLIFIER

(75) Inventor: Swee Yew Choe, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/217,724

(22) Filed: Aug. 12, 2002

(65) Prior Publication Data

US 2004/0027164 A1 Feb. 12, 2004

(51) Int. Cl.$^7$ .............................................. H03K 19/096
(52) U.S. Cl. ........................................... 326/95; 326/83
(58) Field of Search ............................ 326/28, 83, 95, 326/96, 97, 98; 327/437, 434

(56) References Cited

U.S. PATENT DOCUMENTS

| | | |
|---|---|---|
| 4,247,791 A | 1/1981 | Rovell ........................ 307/238 |
| 5,859,548 A | 1/1999 | Kong ........................ 326/113 |
| 6,028,454 A | 2/2000 | Elmasry et al. ............. 326/115 |
| 6,211,704 B1 | 4/2001 | Kong ........................ 326/121 |

OTHER PUBLICATIONS

Choe et al., "Dynamic Half Rail Differential Logic for Low Power", IEEE 1997, pp. 1936 to 1939.

Jung et al., "Modular Charge recycling Pass Transistor Logic (MCRPL)" Electronics Letters, Mar. 2, 2000 vol. 36 No. 5, Mar. 2, 2000, pp. 404 to 405.

Kong et al., "Charge Recycling Differential Logic for Low–Power Application", ISSC96 secession 18, IEEE 0–780331962/98, 1998, pp. 302 to 448.

Choe et al., "Half Rail Differential Logic", ISSCC97/Secession 25/Processors and Logic/Paper SP 25.6 IEEE 0–7803–3721–2/97, 1997, pp. 420 to 421, 336 to 337 and 489.

Won et al., "Modified Half Rail Differential Logic for Reduced Internal Logic Swing", IEEE 0–7803–4455–3/98, 1998, pp. II–157 to II–160.

Kong et al., "Charge Recycling Differential Logic (CRDL) for Low–Power Application", IEEE Journal of Solid–State Circuits, vol. 31, No. 9, Sep. 1996, pp. 1267 to 1276.

*Primary Examiner*—Daniel Chang
(74) *Attorney, Agent, or Firm*—Gunnison, McKay & Hodgson, L.L.P.; Philip J. McKay (57) ABSTRACT

Clocked half-rail differential logic circuits are activated by a delayed clock and include a sense amplifier circuit that is triggered by a second delayed clock. The addition of the sense amplifier circuit, and second delayed clock signal, allows the sense amplifier circuit to act as the driver and therefore there is no need for increasing the size of the differential logic block to provide a driver function. Consequently, the clocked half-rail differential logic circuits of the invention are capable of operating efficiently under heavy load conditions without the increased size and the significant reduction in speed associated with prior art half-rail differential logic circuits.

20 Claims, 4 Drawing Sheets

CLOCKED HALF-RAIL DIFFERENTIAL LOGIC WITH SENSE AMPLIFIER

FIELD OF THE INVENTION

The present invention relates generally to logic circuits and, more particularly, to half-rail differential logic circuits.

BACKGROUND OF THE INVENTION

With the emergence of an electronics market that stresses portability, compact size, lightweight and the capability for prolonged remote operation, a demand has arisen for low power circuits and systems. This demand has motivated circuit designers to depart from conventional circuit designs and venture into more power efficient alternatives. As part of this effort, half-rail differential logic has emerged as an important design tool for increasing power efficiency.

Figure 1:
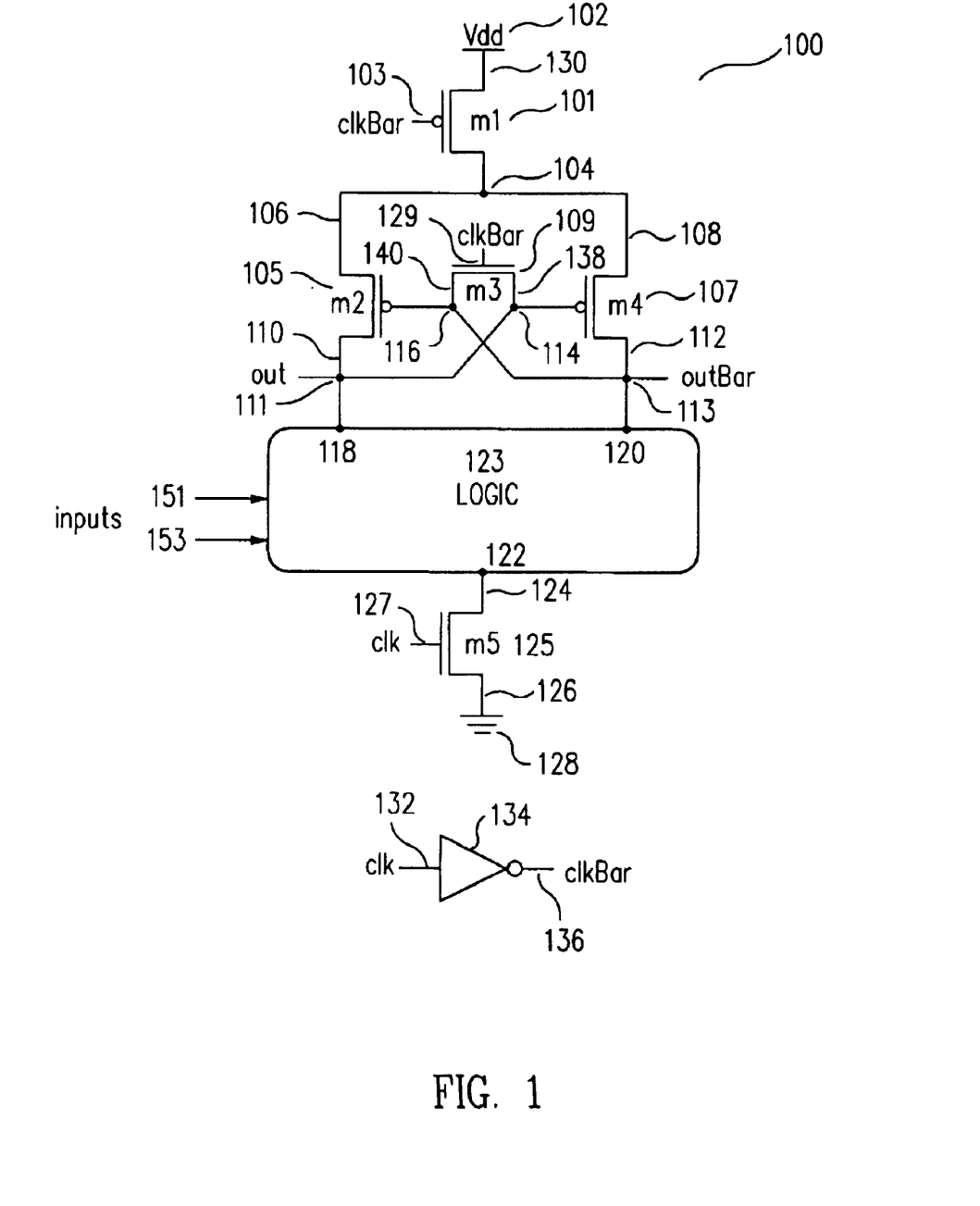
FIG. 1 shows a schematic diagram of a clocked half-rail differential logic circuit.

FIG. 1 shows a schematic diagram of one embodiment of a clocked half-rail differential logic circuit 100 designed according to the principles of the invention set forth in patent application Ser. No. 09/927,751, entitled "Clocked Half-Rail Differential Logic", filed Aug. 9, 2001, in the name of the present invention, assigned to the assignee of the present invention, and incorporated herein by reference, in its entirety. As seen in FIG. 1, a clock signal CLK is coupled to an input node 132 of a clock inverter 134 to yield a clock-not signal CLKBAR at output node 136 of clock inverter 134.

As also seen in FIG. 1, clocked half-rail differential logic circuit 100 includes a first supply voltage 102 coupled to a source, or first flow electrode 130, of a PFET 101. The signal CLKBAR is coupled to a control electrode or gate 103 of first PFET 101 and a control electrode or gate 129 of a first NFET 109. A drain, or second flow electrode 104, of first PFET 101 is coupled to both a source, or first flow electrode 106, of a second PFET 105 and a source, or first flow electrode 108, of a third PFET 107. A control electrode or gate 116 of second PFET 105 is coupled to a first flow electrode 140 of first NFET 109 and an OUTBAR terminal 113. A control electrode or gate 114 of third PFET 107 is coupled to a second flow electrode 138 of first NFET 109 and an OUT terminal 111. A drain, or second flow electrode 110, of second PFET 105 is coupled to OUT terminal 111 and a drain, or second flow electrode 112, of third PFET 107 is coupled to OUTBAR terminal 113.

OUT terminal 111 is coupled to a first terminal 118 of a logic block 123 and OUTBAR terminal 113 is coupled to a second terminal 120 of logic block 123. Logic block 123 includes any type of differential logic and/or circuitry used in the art including various logic gates, logic devices and circuits. Logic block 123 also includes first and second input terminals 151 and 153 that are typically coupled to an OUT and OUTBAR terminal of a previous clocked half-rail differential logic circuit stage (not shown).

Logic block 123 also includes third terminal 122 coupled to a drain, or first flow electrode 124, of a second NFET 125. A gate or control electrode 127 of second NFET 125 is coupled to the signal CLK and a source, or second flow electrode 126, of second NFET 125 is coupled to a second supply voltage 128.

A particular embodiment of a clocked half-rail differential logic circuit 100 is shown in FIG. 1. Those of skill in the art will recognize that clocked half-rail differential logic circuit 100 can be easily modified. For example, different transistors, i.e., first, second and third PFETs 101, 105 and 107 or first and second NFETs 109 and 125 can be used. In particular, the NFETs and PFETS shown in FIG. 1 can be readily exchanged for PFETs and NFETs by reversing the polarities of the supply voltages 102 and 128, or by other well known circuit modifications. Consequently, the clocked half-rail differential logic circuit 100 that is shown in FIG. 1 is simply used for illustrative purposes.

Clocked half-rail differential logic circuit 100 has two modes, or phases, of operation; a pre-charge phase and an evaluation phase. In one embodiment of a clocked half-rail differential logic circuit 100, in the pre-charge phase, the signal CLK is low or a digital "0" and the signal CLKBAR is high or a digital "1". Consequently, first PFET 101 and second NFET 125 are not conducting or are "off" and logic block 123 is isolated from first supply voltage 102 and second supply voltage 128. In addition, during the pre-charge phase, first NFET 109 is conducting or is "on" and, therefore, OUT terminal 111 is shorted to OUTBAR terminal 113. Consequently, the supply voltage to logic block 123 is approximately half the supply voltage 102, i.e., for a first supply voltage 102 of Vdd and a second supply voltage 128 of ground, logic block 123 operates at around Vdd/2. During pre-charge, second and third PFETs 105 and 107 are typically not performing any function.

In one embodiment of a clocked half-rail differential logic circuit 100, in the evaluation phase, the signal CLK is high or a digital "1" and the signal CLKBAR is low or a digital "0". Consequently, first PFET 101 and second NFET 125 are conducting or are "on" and first NFET 109 is not conducting or is "off". Consequently, depending on the particular logic in logic block 123, either second PFET 105, or third PFET 107, is conducting or is "on" and the other of second PFET 105, or third PFET 107, is not conducting or is "off". As a result, either OUT terminal 111 goes from approximately half first supply voltage 102 to approximately second supply voltage 128 or OUTBAR terminal 113 goes from approximately half first supply voltage 102 to approximately first supply voltage 102, i.e., for a first supply voltage 102 of Vdd and a second supply voltage 128 of ground, OUT terminal 111 goes from approximately Vdd/2 to zero and OUTBAR terminal 113 goes from approximately Vdd/2 to Vdd.

Clocked half-rail differential logic circuits 100 marked a significant improvement over prior art half-rail logic circuits in part because clocked half-rail differential logic circuit 100 does not require the complex control circuit of prior art half-rail differential logic circuits and is therefore simpler, saves space and is more reliable than prior art half-rail differential logic circuits. As a result, clocked half-rail differential logic circuits 100 are better suited to the present electronics market that stresses portability, compact size, lightweight and the capability for prolonged remote operation. However, clocked half-rail differential logic circuit 100 has some limitations.

For instance, clocked half-rail differential logic circuit 100 worked very well under conditions of a light load, for instance under conditions where fan out is less than four. However, clocked half-rail differential logic circuit 100 was less useful under conditions of a heavy load, for instance, in cases where fan out exceeded four. The shortcomings of clocked half-rail differential logic circuit 100 arose primarily because under heavy load conditions logic block 123, and the transistors and components making up logic block 123, had to be increased in size to act as a driver for the next stage in the cascade. This in turn meant that logic block 123 was large, slow and inefficient. The problem was further aggravated as additional clocked half-rail differential logic circuits 100 were cascaded together to form the chains commonly used in the industry. Consequently, the full potential of clocked half-rail differential logic circuit 100 was not realized and its use was narrowly limited to light load applications.

What is needed is a method and apparatus for creating clocked half-rail differential logic circuits that are capable of efficient use under heavy loads and are therefore more flexible, more space efficient and more reliable than prior art half-rail differential logic circuits.

SUMMARY OF THE INVENTION

The clocked half-rail differential logic circuits of the invention include a sense amplifier circuit that is triggered by the delayed clock of the following stage, i.e., the clock input to the sense amplifier circuit of the clocked half-rail differential logic circuit with sense amplifier of the invention is additionally delayed with respect to the delayed clock that drives the clocked half-rail differential logic. The addition of the sense amplifier circuit, and second delayed clock signal, according to the invention, allows the sense amplifier circuit to act as the driver and therefore there is no need for increasing the size of the logic block, and the transistors and components making up the logic block, to provide the driver function. Consequently, the clocked half-rail differential logic with sense amplifier circuits of the invention are capable of operating efficiently under heavy load conditions without the increased size and the significant reduction in speed associated with prior art half-rail differential logic circuits. In addition, the clocked half-rail differential logic with sense amplifier circuits of the invention require less space, are simpler, dissipate less heat and have fewer components to potentially fail.

The clocked half-rail differential logic with sense amplifier circuits of the invention can be cascaded together to form the chains commonly used in the industry. When the clocked half-rail differential logic circuits of the invention are cascaded together, the advantages of the clocked half-rail differential logic circuits of the invention are particularly evident and the gains in terms of efficiency, size reduction and flexibility are further pronounced.

In particular, one embodiment of the invention is a cascaded chain of clocked half-rail differential logic circuits. The chain includes a first clocked half-rail differential logic circuit. The first clocked half-rail differential logic circuit includes: a first clocked half-rail differential logic circuit first clock input terminal; at least one first clocked half-rail differential logic circuit data input terminal; at least one first clocked half-rail differential logic circuit data output terminal; and a first clocked half-rail differential logic circuit second clock input terminal.

The cascaded chain of the invention also includes a second clocked half-rail differential logic circuit. The second clocked half-rail differential logic circuit includes: a second clocked half-rail differential logic circuit first clock input terminal; at least one second clocked half-rail differential logic circuit data input terminal; at least one second clocked half-rail differential logic circuit data output terminal; and a second clocked half-rail differential logic circuit second clock input terminal.

According to the invention, the at least one first clocked half-rail differential logic circuit data output terminal is coupled to the at least one second clocked half-rail differential logic circuit data input terminal to form the chain. According to the invention, a first clock signal is coupled to the first clocked half-rail differential logic circuit first clock input terminal and a second clock signal is coupled to the first clocked half-rail differential logic circuit second clock input terminal and the second clocked half-rail differential logic circuit first clock input terminal. According to the invention, the second clock signal is delayed with respect to the first clock signal by a predetermined delay time.

In one embodiment of the invention, a delay circuit is coupled between the first clocked half-rail differential logic circuit clock input terminal and the second clocked half-rail differential logic circuit first clock input terminal to provide the predetermined delay time. In one embodiment of the invention, the delay circuit is also coupled between the first clocked half-rail differential logic circuit clock input terminal and the first clocked half-rail differential logic circuit second clock input terminal to provide the predetermined delay time.

One embodiment of the invention is a clocked half-rail differential logic circuit that includes a clocked half-rail differential logic circuit OUT terminal and a clocked half-rail differential logic circuit OUTBAR terminal.

The clocked half-rail differential logic circuit also includes a first transistor including a first transistor first flow electrode, a first transistor second flow electrode and a first transistor control electrode. The first transistor first flow electrode is coupled to a first supply voltage.

The clocked half-rail differential logic circuit also includes a second transistor, the second transistor including a second transistor first flow electrode, a second transistor second flow electrode and a second transistor control electrode. The first transistor second flow electrode is coupled to the second transistor first flow electrode and the second transistor second flow electrode is coupled to the clocked half-rail differential logic circuit OUT terminal.

The clocked half-rail differential logic circuit also includes a third transistor, the third transistor including a third transistor first flow electrode, a third transistor second flow electrode and a third transistor control electrode. The first transistor second flow electrode is coupled to the third transistor first flow electrode and the third transistor second flow electrode is coupled to the clocked half-rail differential logic circuit OUTBAR terminal.

The clocked half-rail differential logic circuit also includes a fourth transistor, the fourth transistor including a fourth transistor first flow electrode, a fourth transistor second flow electrode and a fourth transistor control electrode. The second transistor control electrode is coupled to the fourth transistor first flow electrode and the clocked half-rail differential logic circuit OUTBAR terminal. The third transistor control electrode is coupled to the fourth transistor second flow electrode and the clocked half-rail differential logic circuit OUT terminal.

The clocked half-rail differential logic circuit also includes a logic block, the logic block including a logic block first input terminal, a logic block second input terminal, a logic block OUT terminal, a logic block OUTBAR terminal and a logic block fifth terminal. The logic block OUT terminal is coupled to the clocked half-rail differential logic circuit OUT terminal and the logic block OUTBAR terminal is coupled to the clocked half-rail differential logic circuit OUTBAR terminal.

The clocked half-rail differential logic circuit also includes a fifth transistor, the fifth transistor including a fifth transistor first flow electrode, a fifth transistor second flow electrode and a fifth transistor control electrode. The fifth transistor first flow electrode is coupled to the logic block fifth terminal and the fifth transistor second flow electrode is coupled to a second supply voltage.

A first clock signal CLKA is coupled to the fifth transistor control electrode of the fifth transistor of the clocked half-rail differential logic circuit. A first clock-not signal CLKBAR is coupled to the first transistor control electrode of the first transistor of the clocked half-rail differential logic circuit and the fourth transistor control electrode of the fourth transistor of the clocked half-rail differential logic circuit.

In one embodiment of the invention, the clocked half-rail differential logic circuit also includes a sense amplifier circuit coupled between the clocked half-rail differential logic circuit OUT terminal and the clocked half-rail differential logic circuit OUTBAR terminal.

In one embodiment of the invention, the clocked half-rail differential logic circuit sense amplifier circuit includes a sixth transistor, the sixth transistor including a sixth transistor first flow electrode, a sixth transistor second flow electrode and a sixth transistor control electrode. The second transistor second flow electrode is coupled to the sixth transistor first flow electrode. The sixth transistor second flow electrode is coupled to a first node. The sixth transistor control electrode is coupled to the fourth transistor second flow electrode and the clocked half-rail differential logic circuit OUTBAR terminal.

In one embodiment of the invention, the clocked half-rail differential logic circuit sense amplifier circuit also includes a seventh transistor, the seventh transistor including a seventh transistor first flow electrode, a seventh transistor second flow electrode and a seventh transistor control electrode. The third transistor second flow electrode is coupled to the seventh transistor first flow electrode. The seventh transistor second flow electrode is coupled to the first node. The seventh transistor control electrode is coupled to the third transistor second flow electrode and the clocked half-rail differential logic circuit OUT terminal.

In one embodiment of the invention, the clocked half-rail differential logic circuit sense amplifier circuit also includes an eighth transistor, the eighth transistor including an eighth transistor first flow electrode, an eighth transistor second flow electrode and an eighth transistor control electrode. The eighth transistor first flow electrode is coupled to the first node and the eighth transistor second flow electrode is coupled to a second supply voltage. A second clock signal CLKB is coupled to the eighth transistor control electrode of the clocked half-rail differential logic with circuit sense amplifier circuit. In one embodiment of the invention, the second clock signal CLKB is delayed a predetermined time with respect to the first clock signal CLKA.

As discussed in more detail below, the clocked half-rail differential logic circuits of the invention are capable of efficient use under heavy loads and are therefore more flexible, more space efficient and more reliable than prior art half-rail differential logic circuits.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

The clocked half-rail differential logic circuits (200 in FIG. 2 and 300A, 300B, 300C and 300N in FIG. 3) of the invention include a sense amplifier circuit (280 in FIG. 2) that is triggered by the delayed clock (CLKB in FIG. 2 and FIG. 3 and CLKC, CLKD, CLKN+1 in FIG. 3) of the following stage, i.e., the clock input to the sense amplifier circuit of the clocked half-rail differential logic circuits of the invention is additionally delayed with respect to the delayed clock that drives the clocked half-rail differential logic. The addition of the sense amplifier circuit and second delayed clock signal, according to the invention, allows the sense amplifier circuit to act as the driver and therefore there is no need for increasing the size of the logic block (223 in FIG. 2), and the transistors and components making up the logic block, to provide the driver function. Consequently, the clocked half-rail differential logic with sense amplifier circuits of the invention are capable of operating efficiently under heavy load conditions without the significant reduction in speed associated with prior art half-rail differential logic circuits. In addition, the clocked half-rail differential logic circuits of the invention require less space, are simpler, dissipate less heat and have fewer components to potentially fail.

The clocked half-rail differential logic circuits of the invention can be cascaded together to form the chains (301 in FIG. 3) commonly used in the industry. When the clocked half-rail differential logic circuits of the invention are cascaded together, the advantages of the clocked half-rail differential logic circuits of the invention are particularly evident and the gains in terms of efficiency, size reduction and flexibility are further pronounced.

Figure 2:
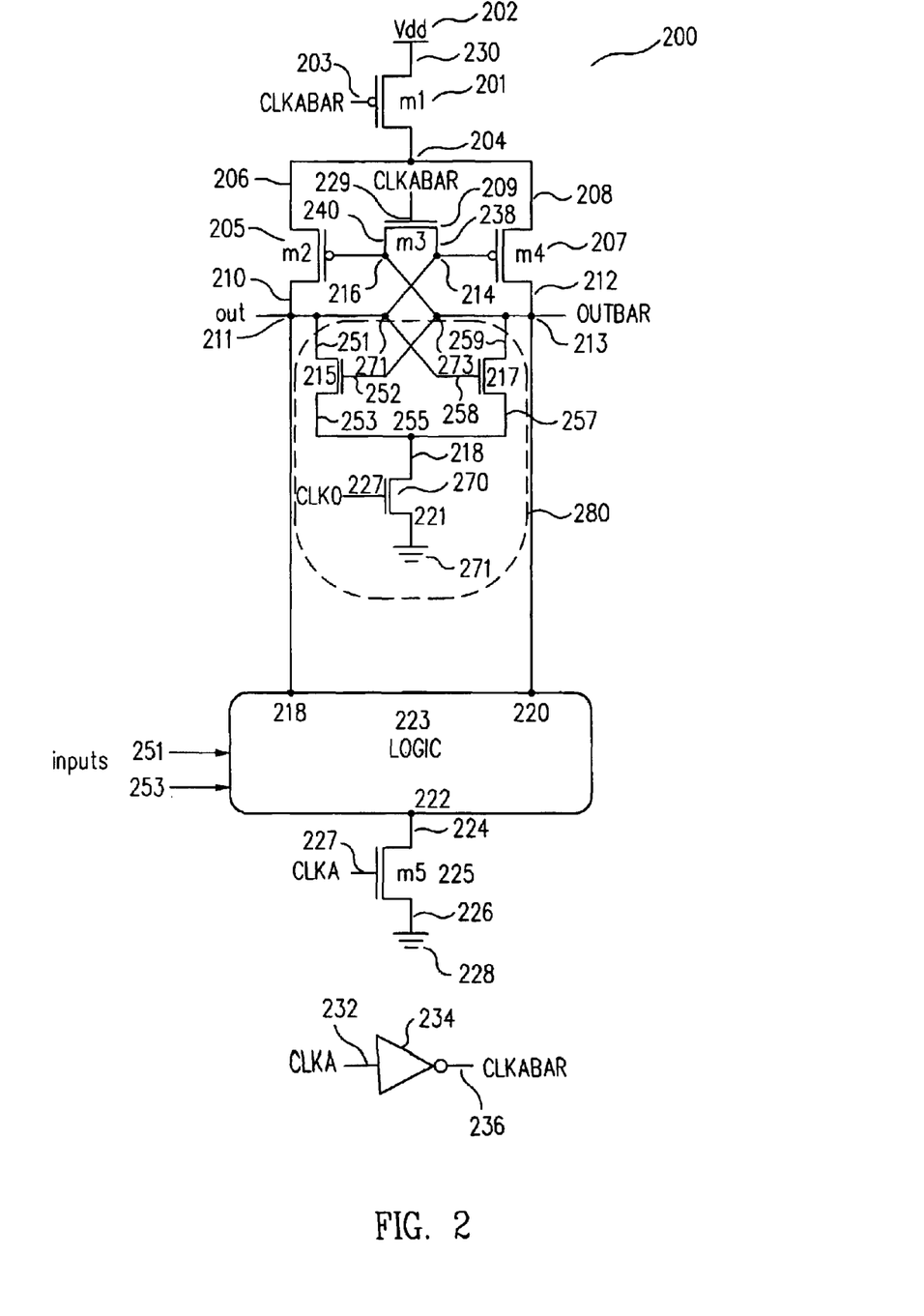
FIG. 2 shows a schematic diagram of one embodiment of a clocked half-rail differential logic circuit designed according to the principles of the present invention to include a sense amplifier.

FIG. 2 shows a schematic diagram of one embodiment of a clocked half-rail differential logic with sense amplifier circuit 200 designed according to the principles of the present invention. As seen in FIG. 2, a clock signal CLKA is coupled to an input node 232 of a clock inverter 234 to yield a clock-not signal CLKBAR at output node 236 of clock inverter 234.

As also seen in FIG. 2, clocked half-rail differential logic with sense amplifier circuit 200 includes a first supply voltage 202 coupled to a source, or first flow electrode 230, of a PFET 201. The signal CLKBAR is coupled to a control electrode or gate 203 of first PFET 201 and a control electrode or gate 229 of a first NFET 209. A drain, or second flow electrode 204, of first PFET 201 is coupled to both a source, or first flow electrode 206, of a second PFET 205 and a source, or first flow electrode 208, of a third PFET 207. A control electrode or gate 216 of second PFET 205 is coupled to a first flow electrode 240 of first NFET 209 and an OUTBAR terminal 213. A control electrode or gate 214 of third PFET 207 is coupled to a second flow electrode 238 of first NFET 209 and an OUT terminal 211. A drain, or second flow electrode 210, of second PFET 205 is coupled to OUT terminal 211 and a drain, or second flow electrode 212, of third PFET 207 is coupled to OUTBAR terminal 213.

OUT terminal 211 is coupled to a first terminal 218 of a logic block 223 and OUTBAR terminal 213 is coupled to a second terminal 220 of logic block 223. Logic block 223 includes any type of differential logic and/or circuitry used in the art including various logic gates, logic devices and circuits. Logic block 223 also includes first and second input terminals 251 and 253 that are typically coupled to an OUT and OUTBAR terminal of a previous clocked half-rail differential logic circuit stage (not shown).

Logic block 223 also includes third terminal 222 coupled to a drain, or first flow electrode 224, of a second NFET 225. A gate or control electrode 227 of second NFET 225 is coupled to the signal CLKA and a source, or second flow electrode 226, of second NFET 225 is coupled to a second supply voltage 228.

According to the invention, clocked half-rail differential logic with sense amplifier circuit 200 also includes sense amplifier circuit 280. In one embodiment of the invention, sense amplifier circuit 280 includes a sixth transistor, NFET 215, including a drain 251, a source 253 and a control electrode or gate 252. Drain 210 of PFET 205 is coupled to drain 251 of NFET 215. Source 253 of NFET 215 is coupled to a first node 255. Gate 252 of NFET 215 is coupled to source 240 of NFET 209 and clocked half-rail differential logic circuit OUTBAR terminal 213.

In one embodiment of the invention, sense amplifier circuit 280 also includes a seventh transistor, NFET 217, including a drain 259, a source 257 and a control electrode or gate 258. Drain 212 of PFET 207 is coupled to drain 259 of NFET 217. Source 257 of NFET 217 is coupled to first node 255. Gate 258 of NFET 217 is coupled to drain 238 of NFET 209 and clocked half-rail differential logic circuit OUT terminal 211.

In one embodiment of the invention, sense amplifier circuit 280 of clocked half-rail differential logic with sense amplifier circuit 200 also includes an eighth transistor, NFET 270, including a drain 218, a source 221 and a control electrode or gate 277. Drain 218 of NFET 270 is coupled to first node 255. Source 221 of NFET 270 is coupled to a second supply voltage 271. A delayed, or second, clock signal CLKB is coupled to control electrode or gate 277 of NFET 270. According to one embodiment of the invention, clock signal CLKB is delayed with respect to clock signal CLKA by a predetermined time.

A particular embodiment of a clocked half-rail differential logic with sense amplifier circuit 200 is shown in FIG. 2. Those of skill in the art will recognize that clocked half-rail differential logic with sense amplifier circuit 200 can be easily modified. For example, different transistors, i.e., PFETs 201, 205 and 207 or NFETs 209, 215, 217, 270 and 225 can be used. In particular, the NFETs and PFETS shown in FIG. 2 can be readily exchanged for PFETs and NFETs by reversing the polarities of the supply voltages 202 and 228, or by other well known circuit modifications. Consequently, the clocked half-rail differential logic with sense amplifier circuit 200 that is shown in FIG. 2 is simply used for illustrative purposes.

As discussed above, clocked half-rail differential logic with sense amplifier circuit 200 of the invention includes sense amplifier circuit 280 that is triggered by delayed, or second, clock signal CLKB of the following stage, i.e., the clock signal CLKB to gate 277 of NFET 270 of sense amplifier circuit 280 is additionally delayed with respect to the first clock signal CLKA. As also noted above, Clock signal CLKA is coupled to control electrode 227 of NFET 270. Clock-not signal CLKBAR is coupled to gate 203 of PFET 201 and gate 229 of NFET 209. The addition of sense amplifier circuit 280 and second delayed clock signal CLKB, according to the invention, allows sense amplifier circuit 280 to act as the driver circuit and therefore there is no need for increasing the size of the logic block 223, or the components of logic block 223, to provide the driver function. Consequently, clocked half-rail differential logic with sense amplifier circuit 200 of the invention is capable of operating efficiently under heavy load conditions without the significant reduction in speed associated with half-rail differential logic circuits 100. In addition, clocked half-rail differential logic with sense amplifier circuit 200 requires less space, is simpler, dissipates less heat and has fewer components to potentially fail.

As also discussed above, clocked half-rail differential logic with sense amplifier circuit 200 can be cascaded together with other clocked half-rail differential logic with sense amplifier circuits 200 to form the chains commonly used in the industry. When clocked half-rail differential logic with sense amplifier circuits 200 of the invention are cascaded together, the advantages of clocked half-rail differential logic with sense amplifier circuit 200 is particularly evident and the gains in terms of efficiency, size reduction and flexibility are further pronounced.

When clocked half-rail differential logic with sense amplifier circuits 200 of the invention are cascaded together, the first clock signal CLKA is, according to the invention, timed to be at least the delay of the previous clocked half-rail differential logic with sense amplifier circuit 200 (not shown) to ensure each clocked half-rail differential logic with sense amplifier circuit 200 of the invention is switched or "fired" only after it has received an input from the previous clocked half-rail differential logic with sense amplifier circuit 200.

Figure 3:
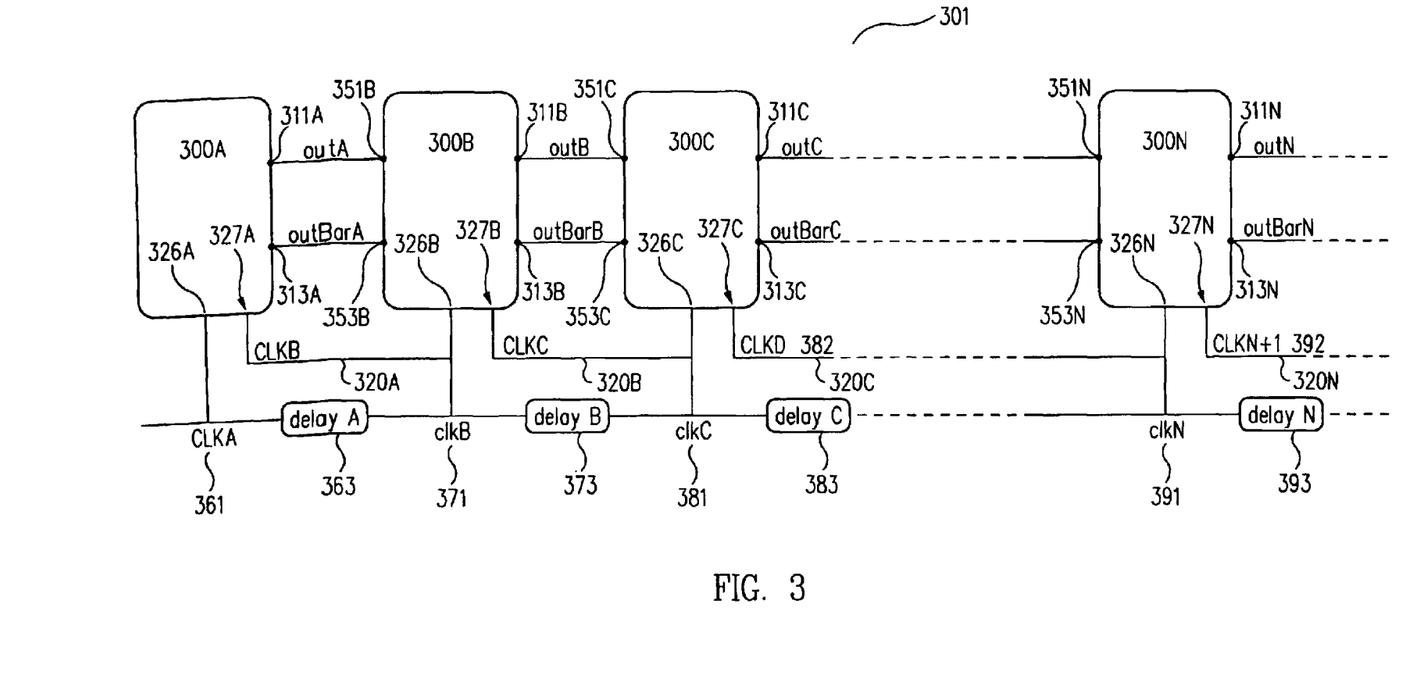
FIG. 3 shows one embodiment of a cascaded chain of clocked half-rail differential logic circuits according to the principles of the present invention.

FIG. 3 shows one embodiment of a cascaded chain 301 of clocked half-rail differential logic with sense amplifier circuits 300A, 300B, 300C and 300N of the present invention. Each clocked half-rail differential logic with sense amplifier circuit 300A, 300B, 300C and 300N represents a stage in cascaded chain 301. In one embodiment of the invention, each clocked half-rail differential logic with sense amplifier circuit 300A, 300B, 300C and 300N is similar to clocked half-rail differential logic with sense amplifier circuit 200 discussed above with respect to FIG. 2.

As seen in FIG. 3, clocked half-rail differential logic with sense amplifier circuit 300A includes: a first clock input terminal 326A; a second clock input terminal 327A; an OUT terminal 311A; and an OUTBAR terminal 313A.

Clocked half-rail differential logic circuit 300B includes: a first clock input terminal 326B; a second clock input terminal 327B; an input terminal 351B, coupled to OUT terminal 311A of clocked half-rail differential logic with sense amplifier circuit 300A; an inputBar terminal 353B, coupled to OUTBAR terminal 313A of clocked half-rail differential logic with sense amplifier circuit 300A; an output terminal 311B; and an OUTBAR terminal 313B. Likewise, clocked half-rail differential logic circuit 300C includes: a first clock input terminal 326C; a second clock input terminal 327C; an input terminal 351C, coupled to output terminal 311B of clocked half-rail differential logic circuit 300B; an inputBar terminal 353C, coupled to OUTBAR terminal 313B of clocked half-rail differential logic circuit 300B; an output terminal 311C; and an OUTBAR terminal 313C.

Clocked half-rail differential logic circuit 300N includes: a first clock input terminal 326N; a second clock input terminal 327N; an input terminal 351N, coupled to an output terminal 311N−1 (not shown) of a clocked half-rail differential logic circuit 300N−1 (not shown); an inputBar terminal 353N, coupled to an OUTBAR terminal 313N−1 (not shown) of a clocked half-rail differential logic circuit 300N−1 (not shown); an output terminal 311N; and an OUTBAR terminal 313N.

According to the invention, any number of clocked half-rail differential logic with sense amplifier circuits 300A, 300B, 300C and 300N can be employed with cascaded chain 301. As also shown in FIG. 3, and discussed above, output terminal 311A of clocked half-rail differential logic with sense amplifier circuit 300A couples signal OUTA to input terminal 351B of clocked half-rail differential logic circuit 300B and OUTBAR terminal 313A of clocked half-rail differential logic with sense amplifier circuit 300A couples signal OUTBARA to inputBar terminal 353B of clocked half-rail differential logic circuit 300B. Likewise, output terminal 311B of clocked half-rail differential logic circuit 300B couples signal OUTB to input terminal 351C of clocked half-rail differential logic circuit 300C and OUTBAR terminal 313B of clocked half-rail differential logic circuit 300B couples signal OUTBARB to inputBar terminal 353C of clocked half-rail differential logic circuit 300C. In addition, output terminal 311N of clocked half-rail differential logic circuit 300N couples signal OUTN to an input terminal 351N+1 (not shown) of a clocked half-rail differential logic circuit 300N+1 (not shown) and OUTBAR terminal 313N of clocked half-rail differential logic circuit 300N couples signal OUTBARN to an inputBar terminal 353N+1 (not shown) of a clocked half-rail differential logic circuit 300N+1 (not shown).

According to the invention, each clocked half-rail differential logic with sense amplifier circuit 300A, 300B, 300C and 300N of cascaded chain 301 receives its own delayed first clock signal CLKA 361, CLKB 371, CLKC 381 and CLKN 391, respectively. According to the invention clock signals CLKA 361, CLKB 371, CLKC 381 and CLKN 391 are provided to clocked half-rail differential logic with sense amplifier circuits 300A, 300B, 300C and 300N, respectively, by introducing delay circuits 363, 373, 383 and 393 between successive clocked half-rail differential logic with sense amplifier circuits 300A, 300B, 300C and 300N. Consequently, delay circuit 363 introduces a delay time between signal CLKA 361, coupled to first clock input terminal 326A of clocked half-rail differential logic with sense amplifier circuit 300A, and signal CLKB 371, coupled to first clock input terminal 326B of clocked half-rail differential logic circuit 300B. Delay circuit 373 introduces a delay time between signal CLKB 371 and signal CLKC 381, coupled to first clock input terminal 326C of clocked half-rail differential logic circuit 300C. Two delay circuits 363 and 373 introduce two delay times between signal CLKA 361 and signal CLKC 381. Likewise, a series of N−1 delay circuits, and N−1 delay times, exists between signal CLKA 361 and signal CLKN 391, coupled to first clock input terminal 326N of clocked half-rail differential logic circuit 300N, and a further delay circuit 393 introduces a further delay time between CLKN 391 and CLK N+1 (not shown) coupled to a first clock input terminal 326N+1 (not shown) of a clocked half-rail differential logic circuit 300N+1 (not shown).

Delay circuits 363, 373, 383 and 393 are any one of many delay circuits known in the art such as inverters, or groups of inverters, gates, transistors or any other elements that introduce a time delay. According to the invention, delay circuits 363, 373, 383 and 393 are used to ensure the activation of each stage, i.e., each clocked half-rail differential logic with sense amplifier circuit 300A, 300B, 300C and 300N, is timed such that the delay of the clock is longer than the evaluation duration of the previous stage. In one embodiment of the invention, the delayed clock signals CLKA 361, CLKB 371, CLKC 381 and CLKN 391 are timed to switch high (active) when the differential input voltage to clocked half-rail differential logic with sense amplifier circuit 300A, 300B, 300C and 300N reaches a predetermined voltage level. The clock delay can be adjusted according to the predetermined differential voltage level required for robustness and the specific needs of the circuit designer. This differential voltage level is typically a function of process and will vary from circuit to circuit and system to system.

In addition, according to the invention, each clocked half-rail differential logic with sense amplifier circuit 300A, 300B, 300C and 300N of cascaded chain 301 receives a second delayed clock signal at its second clock input terminal 327A, 327B, 327C and 327N, respectively. In one embodiment of the invention, the second delayed clock signal for a given clocked half-rail differential logic with sense amplifier circuit 300A, 300B, 300C and 300N of cascaded chain 301 is the delayed clock signal of the following clocked half-rail differential logic with sense amplifier circuit 300A, 300B, 300C and 300N in cascaded chain 301. In this embodiment of the invention, the second delayed clock signal for a given clocked half-rail differential logic with sense amplifier circuit 300A, 300B, 300C and 300N of cascaded chain 301 is provided by coupling the second clock terminal 327A, 327B, 327C and 327N of a given clocked half-rail differential logic with sense amplifier circuit 300A, 300B, 300C and 300N, respectively, to the first clock input terminal 326B, 326C, 326D (not shown), 326N and 326N+1 (not shown) of the following stage 300B, 300C, 300N and 300N+1 (not shown).

Thus, in FIG. 3, line 320A couples second clock input terminal 327A of clocked half-rail differential logic with sense amplifier circuit 300A to first clock input terminal 326B of clocked half-rail differential logic circuit 300B and delay circuit 363 introduces a delay time between signal CLKA 361, coupled to first clock input terminal 326A of clocked half-rail differential logic with sense amplifier circuit 300A, and signal CLKB 371, coupled to second clock input terminal 327A of clocked half-rail differential logic with sense amplifier circuit 300A. Likewise, line 320B couples second clock input terminal 327B of clocked half-rail differential logic circuit 300B to first clock input terminal 326C of clocked half-rail differential logic circuit 300C and delay circuit 373 introduces a delay time between signal CLKB 371, coupled to first clock input terminal 326B of clocked half-rail differential logic circuit 300B, and signal CLKC 381, coupled to second clock input terminal 327B of clocked half-rail differential logic circuit 300B.

Similarly, line 320C couples second clock input terminal 327C of clocked half-rail differential logic circuit 300C to first clock input terminal 326D (not shown) of a clocked half-rail differential logic circuit 300D (not shown) and delay circuit 383 introduces a delay time between signal CLKC 381, coupled to first clock input terminal 326C of clocked half-rail differential logic circuit 300C, and signal CLKD 382, coupled to second clock input terminal 327C of clocked half-rail differential logic circuit 300C. Likewise, line 320N couples first clock input terminal 326N+1 (not shown) of a clocked half-rail differential logic circuit 300N+1 (not shown) to second clock input terminal 327N of clocked half-rail differential logic circuit 300N and delay circuit 393 introduces a delay time between signal CLKN 391, coupled to first clock input terminal 326N of clocked half-rail differential logic circuit 300N, and signal CLKN+1 392, coupled to second clock input terminal 327N of clocked half-rail differential logic circuit 300N.

In one embodiment of the invention, second clock input terminals 327A, 327B, 327C and 327N of clocked half-rail differential logic with sense amplifier circuits 300A, 300B, 300C and 300N, respectively, are coupled to sense amplifiers (not shown in FIG. 3) in clocked half-rail differential logic with sense amplifier circuits 300A, 300B, 300C and 300N, such as sense amplifier circuit 280 in FIG. 2, and the signals CLKB, CLKC, CLKD, and CLKN+1 are used as described above with respect to FIG. 2 to trigger the sense amplifiers (not shown in FIG. 3) in clocked half-rail differential logic with sense amplifier circuits 300A, 300B, 300C and 300N.

Figure 4:
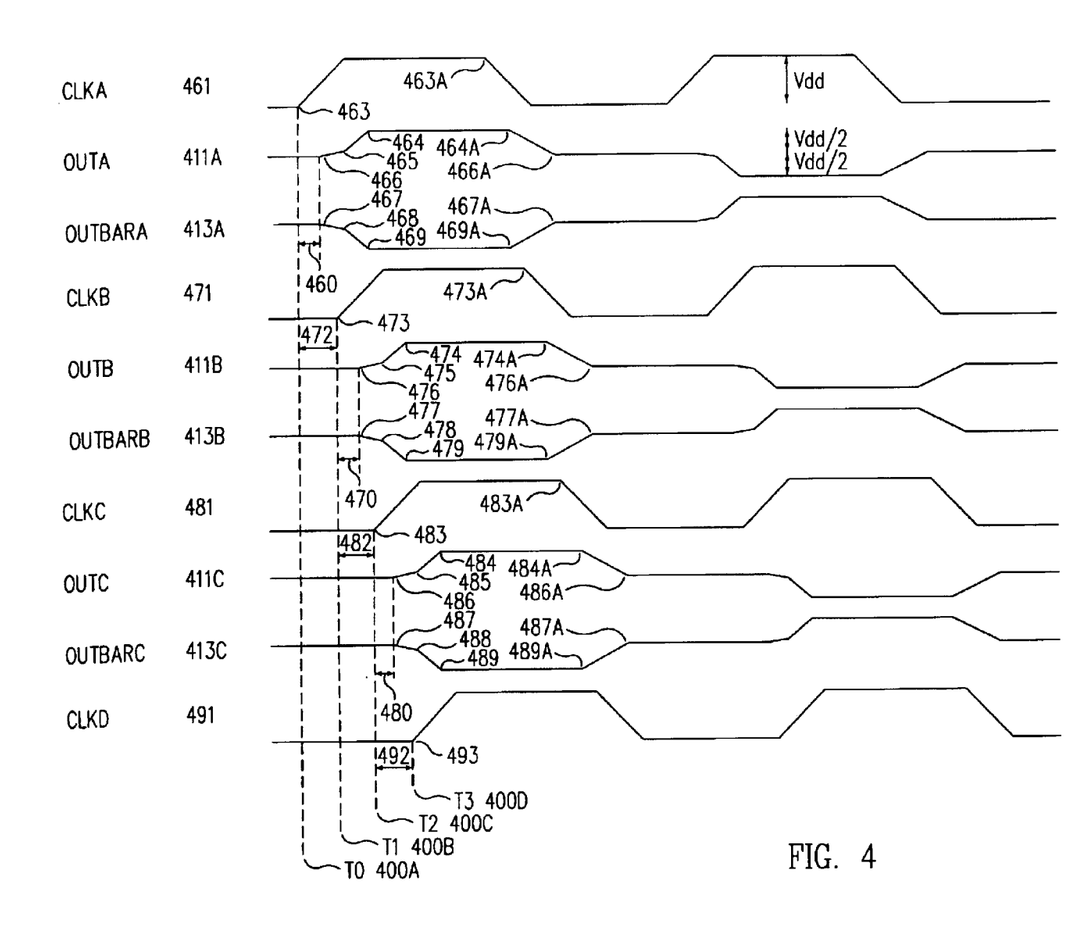
FIG. 4 is a one embodiment of a timing diagram for the cascaded chain of clocked half-rail differential logic circuits of the invention shown in FIG. 3.

FIG. 4 is one embodiment of a timing diagram for cascaded chain 301 of clocked half-rail differential logic with sense amplifier circuits 300A, 300B, 300C and 300N of FIG. 3. As seen in FIG. 3 and FIG. 4 together, according to one embodiment of the invention, at time T0, i.e., point T0 400A in FIG. 4, signal CLKA 461 starts to go high. After a short switching delay 460, such as the short switching delay inherent in any circuit, signal OUTA 411A at OUTA terminal 311A starts to switch high at point 466. Corresponding signal OUTBARA at OUTBAR terminal 313A starts to discharge to low at point 467. Note that, as discussed above, points 466 and 467 typically represent potentials of approximately Vdd/2.

According to the present invention, signal CLKB 471 is delayed a delay time 472 with respect to signal CLKA 461 by delay circuit 363. At point 473, i.e., time T1 400B, signal CLKB 471 starts to rise and thereby activates a sense amplifier, such as sense amplifier 280 in FIG. 2, which, according to the invention, is part of clocked half-rail differential logic with sense amplifier circuit 300A. Once the sense amplifier is activated, Output OUTA 411A pulls strongly to high starting at point 465 and reaches high point 464 rapidly. Note the difference in the slope of signal OUTA between points 466 and 465, when the sense amplifier is not activated, and points 465 and 464, when the sense amplifier is activated. Likewise, corresponding signal OUTBARA 413A pulls strongly low, starting at point 468, to low point 469 when the sense amplifier is activated.

At point 463A, in its pre-charge phase, CLKA 461 starts to switch low. After a short delay, OUTA 411A and OUTBARA 413A begin to equalize at points 464A and 469A, respectively, and reach approximate equilibrium at points 466A and 467A at a potential close to Vdd/2.

As also seen in FIG. 3 and FIG. 4 together, according to one embodiment of the invention, at time T1, i.e., point T1 400B in FIG. 4, signal CLKB 471 starts to go high. After a short switching delay 470, such as the short switching delay inherent in any circuit, signal OUTB 411B at OUTB terminal 311B starts to switch high at point 476. Corresponding signal OUTBARB at OUTBAR terminal 313B starts to discharge to low at point 477. Note that, as discussed above, points 476 and 477 typically represent potentials of approximately Vdd/2.

According to the present invention, signal CLKC 481 is delayed a delay time 482 with respect to signal CLKB 471 by delay circuit 373. At point 483, i.e., time T2 400C, signal CLKC 481 starts to rise and thereby activates a sense amplifier, such as sense amplifier 280 in FIG. 2, which, according to the invention, is part of clocked half-rail differential logic circuit 300B. Once the sense amplifier is activated, Output OUTB 411B pulls strongly to high starting at point 475 and reaches high point 474 rapidly. Note the difference in the slope of signal OUTB between points 476 and 475, when the sense amplifier is not activated, and points 475 and 474, when the sense amplifier is activated. Likewise, corresponding signal OUTBARB 413B pulls strongly low, starting at point 478, to low point 479 when the sense amplifier is activated.

At point 473A, in its pre-charge phase, CLKB 471 starts to switch low. After a short delay, OUTB 411B and OUTBARB 413B begin to equalize at points 474A and 479A, respectively, and reach approximate equilibrium at points 476A and 477A at a potential close to Vdd/2.

As also seen in FIG. 3 and FIG. 4 together, according to one embodiment of the invention, at time T2, i.e., point T2 400c in FIG. 4, signal CLKC 481 starts to go high. After a short switching delay 480, such as the short switching delay inherent in any circuit, signal OUTC 411C at OUTC terminal 311C starts to switch high at point 486. Corresponding signal OUTBARC at OUTBAR terminal 313C starts to discharge to low at point 487. Note that, as discussed above, points 486 and 487 typically represent potentials of approximately Vdd/2.

According to the present invention, signal CLKD 491 is delayed a delay time 492 with respect to signal CLKC 481 by delay circuit 383. At point 493, i.e., time T3 400D, signal CLKD 491 starts to rise and thereby activates a sense amplifier, such as sense amplifier 280 in FIG. 2, which, according to the invention, is part of clocked half-rail differential logic circuit 300C. Once the sense amplifier is activated, Output OUTC 411C pulls strongly to high starting at point 485 and reaches high point 484 rapidly. Note the difference in the slope of signal OUTC between points 486 and 485, when the sense amplifier is not activated, and points 485 and 484, when the sense amplifier is activated. Likewise, corresponding signal OUTBARC 413C pulls strongly low, starting at point 488, to low point 489 when the sense amplifier is activated.

At point 483A, in its pre-charge phase, CLKC 481 starts to switch low. After a short delay, OUTC 411C and OUTBARC 413C begin to equalize at points 484A and 489A, respectively, and reach approximate equilibrium at points 486A and 487A at a potential close to Vdd/2.

As discussed above, according to the invention, any number of clocked half-rail differential logic with sense amplifier circuits 300A, 300B, 300C and 300N can be employed with cascaded chain 301. In addition, the process discussed above will repeat for each switching of the system clock. Those of skill in the art will further recognize that the choice of signal highs and signal lows was made arbitrarily in FIG. 4 for illustrative purposes only and that at other times, and in other embodiments of the invention, signal highs could be replaced with signal lows and vice-versa.

As discussed above, clocked half-rail differential logic with sense amplifier circuits 200, 300A, 300B, 300C and 300N of the invention include sense amplifier circuit 280 that is triggered by the delayed clock of the following stage, i.e., the clock input to the sense amplifier circuit of the clocked half-rail differential logic circuits of the invention is additionally delayed with respect to the delayed clock that drives the half-rail differential logic. The addition of the sense amplifier circuit, and second delayed clock signal, according to the invention, allows the sense amplifier circuit to act as the driver and therefore there is no need for increasing the size of the logic block, or the transistors and components making up the logic block, to provide the driver function. Consequently, the clocked half-rail differential logic circuits of the invention are capable of operating efficiently under heavy load conditions without the increased size and the significant reduction in speed associated with prior art half-rail differential logic circuits. In addition, the clocked half-rail differential logic circuits of the invention require less space, are simpler, dissipate less heat and have fewer components to potentially fail.

As also discussed above, the clocked half-rail differential logic circuits of the invention can be cascaded together to form the chains commonly used in the industry. When the clocked half-rail differential logic circuits of the invention are cascaded together, the advantages of the clocked half-rail differential logic circuits of the invention are particularly evident and the gains in terms of efficiency, size reduction and flexibility are further pronounced.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A cascaded chain of synchronous clocked half-rail differential logic circuits comprising:
    a first synchronous clocked half-rail differential logic circuit, said first synchronous clocked half-rail differential logic circuit comprising:
        a first synchronous clocked half-rail differential logic circuit first clock input terminal;
        a first synchronous clocked half-rail differential logic circuit second clock input terminal;
        at least one first synchronous clocked half-rail differential logic circuit data input terminal; and
        at least one first synchronous clocked half-rail differential logic circuit data output terminal;
    a second synchronous clocked half-rail differential logic circuit, said second synchronous clocked half-rail differential logic circuit comprising:
        a second synchronous clocked half-rail differential logic circuit first clock input terminal;
        a second synchronous clocked half-rail differential logic circuit second clock input terminal;
        at least one second synchronous clocked half-rail differential logic circuit data input terminal; and
        at least one second synchronous clocked half-rail differential logic circuit data output terminal;
    a first clock signal coupled to said first synchronous clocked half-rail differential logic circuit first clock input terminal;
    a second clock signal coupled to said second synchronous clocked half-rail differential logic circuit first clock input terminal and said first synchronous clocked half-rail differential logic circuit second clock input terminal, wherein;
    said at least one first synchronous clocked half-rail differential logic circuit data output terminal is coupled to said at least one second synchronous clocked half-rail differential logic circuit data input terminal, further wherein;
    said second clock signal is said first clock signal delayed by a predetermined fixed delay time such that said second synchronous clocked half-rail differential logic circuit is switched only after it has received an input from said first second synchronous clocked half-rail differential logic circuit.

2. The cascaded chain of synchronous clocked half-rail differential logic circuits of claim 1, further comprising:
    a delay circuit coupled between said first synchronous clocked half-rail differential logic circuit clock input terminal and said second synchronous clocked half-rail differential logic circuit clock input terminal for delaying said second clock signal with respect to said first clock signal by said predetermined delay time.

3. The cascaded chain of synchronous clocked half-rail differential logic circuits of claim 2, wherein;
    said delay circuit comprises at least one inverter.

4. The cascaded chain of synchronous clocked half-rail differential logic circuits of claim 2, wherein;
    said first synchronous clocked half-rail differential logic circuit comprises a sense amplifier circuit coupled to said first synchronous clocked half-rail differential logic circuit second clock input terminal; and
    said second synchronous clocked half-rail differential logic circuit comprises a sense amplifier circuit coupled to said second synchronous clocked half-rail differential logic circuit second clock input terminal.

5. A cascaded chain of clocked half-rail differential logic circuits comprising:
    a first supply voltage;
    a second supply voltage;
    a first clocked half-rail differential logic circuit, said first clocked half-rail differential logic circuit comprising:
        a first clocked half-rail differential logic circuit OUT terminal;
        a first clocked half-rail differential logic circuit OUT-BAR terminal;
    a first transistor, said first transistor comprising a first transistor first flow electrode, a first transistor second flow electrode and a first transistor control electrode, said first supply voltage being coupled to said first transistor first flow electrode;
    a second transistor, said second transistor comprising a second transistor first flow electrode, a second transistor second flow electrode and a second transistor control electrode, said first transistor second flow electrode being coupled to said second transistor first flow electrode, said second transistor second flow electrode being coupled to said first clocked half-rail differential logic circuit OUT terminal;
    a third transistor, said third transistor comprising a third transistor first flow electrode, a third transistor second flow electrode and a third transistor control electrode, said first transistor second flow electrode being coupled to said third transistor first flow electrode, said third transistor second flow electrode being coupled to said first clocked half-rail differential logic circuit OUT-BAR terminal;
    a fourth transistor, said fourth transistor comprising a fourth transistor first flow electrode, a fourth transistor second flow electrode and a fourth transistor control electrode, said second transistor control electrode being coupled to said fourth transistor first flow electrode and said first clocked half-rail differential logic circuit OUTBAR terminal, said third transistor control electrode being coupled to said fourth transistor second flow electrode and said first clocked half-rail differential logic circuit OUT terminal;

a logic block, said logic block comprising a logic block first input terminal, a logic block second input terminal, a logic block OUT terminal, a logic block OUTBAR terminal and a logic block fifth terminal, said logic block OUT terminal being coupled to said first clocked half-rail differential logic circuit OUT terminal, said logic block OUTBAR terminal being coupled to said first clocked half-rail differential logic circuit OUTBAR terminal;

a fifth transistor, said fifth transistor comprising a fifth transistor first flow electrode, a fifth transistor second flow electrode and a fifth transistor control electrode, said fifth transistor first flow electrode being coupled to said logic block fifth terminal, said fifth transistor second flow electrode being coupled to said second supply voltage;

a first clocked half-rail differential logic circuit sense amplifier circuit coupled between said first clocked half-rail differential logic circuit OUT terminal and said first clocked half-rail differential logic circuit OUTBAR terminal, said first clocked half-rail differential logic circuit sense amplifier circuit having an input terminal coupled to a second clock signal;

a second clocked half-rail differential logic circuit, said second clocked half-rail differential logic circuit comprising:

a second clocked half-rail differential logic circuit OUT terminal;

a second clocked half-rail differential logic circuit OUTBAR terminal;

a first transistor, said first transistor comprising a first transistor first flow electrode, a first transistor second flow electrode and a first transistor control electrode, said first supply voltage being coupled to said first transistor first flow electrode;

a second transistor, said second transistor comprising a second transistor first flow electrode, a second transistor second flow electrode and a second transistor control electrode, said first transistor second flow electrode being coupled to said second transistor first flow electrode, said second transistor second flow electrode being coupled to said first clocked half-rail differential logic circuit OUT terminal;

a third transistor, said third transistor comprising a third transistor first flow electrode, a third transistor second flow electrode and a third transistor control electrode, said first transistor second flow electrode being coupled to said third transistor first flow electrode, said third transistor second flow electrode being coupled to said first clocked half-rail differential logic circuit OUTBAR terminal;

a fourth transistor, said fourth transistor comprising a fourth transistor first flow electrode, a fourth transistor second flow electrode and a fourth transistor control electrode, said second transistor control electrode being coupled to said fourth transistor first flow electrode and said first clocked half-rail differential logic circuit OUTBAR terminal, said third transistor control electrode being coupled to said fourth transistor second flow electrode and said first clocked half-rail differential logic circuit OUT terminal;

a logic block, said logic block comprising a logic block first input terminal, a logic block second input terminal, a logic block OUT terminal, a logic block OUTBAR terminal and a logic block fifth terminal, said logic block OUT terminal being coupled to said first clocked half-rail differential logic circuit OUT terminal, said logic block OUTBAR terminal being coupled to said first clocked half-rail differential logic circuit OUTBAR terminal;

a fifth transistor, said fifth transistor comprising a fifth transistor first flow electrode, a fifth transistor second flow electrode and a fifth transistor control electrode, said fifth transistor first flow electrode being coupled to said logic block fifth terminal, said fifth transistor second flow electrode being coupled to said second supply voltage;

a second clocked half-rail differential logic circuit sense amplifier circuit coupled between said second clocked half-rail differential logic circuit OUT terminal and said second clocked half-rail differential logic circuit OUTBAR terminal, said second clocked half-rail differential logic circuit sense amplifier circuit having an input terminal coupled to a third clock signal, wherein;

said second clock signal is delayed with respect to a first clock signal by a predetermined delay time and said third clock signal is delayed with respect to said second clock signal by a predetermined delay time.

6. The cascaded chain of clocked half-rail differential logic circuits of claim 5, wherein;

said a first clocked half-rail differential logic circuit sense amplifier circuit comprises:

a sixth transistor, said sixth transistor comprising a sixth transistor first flow electrode, a sixth transistor second flow electrode and a sixth transistor control electrode, said second transistor second flow electrode being coupled to said sixth transistor first flow electrode, said sixth transistor second flow electrode being coupled to a first clocked half-rail differential logic circuit first node, said sixth transistor control electrode being coupled to said fourth transistor first flow electrode and said first clocked half-rail differential logic circuit OUTBAR terminal;

a seventh transistor, said seventh transistor comprising a seventh transistor first flow electrode, a seventh transistor second flow electrode and a seventh transistor control electrode, said third transistor second flow electrode being coupled to said seventh transistor first flow electrode, said seventh transistor second flow electrode being coupled to said first clocked half-rail differential logic circuit first node, said seventh transistor control electrode being coupled to said fourth transistor second flow electrode and said first clocked half-rail differential logic circuit OUT terminal;

an eighth transistor, said eighth transistor comprising an eighth transistor first flow electrode, an eighth transistor second flow electrode and an eighth transistor control electrode, said eighth transistor first flow electrode being coupled to said first clocked half-rail differential logic circuit first node, said eighth transistor second flow electrode being coupled to said second supply voltage, said eighth transistor control electrode being coupled to receive said second clock signal, further wherein;

said a second clocked half-rail differential logic circuit sense amplifier circuit comprises:
  a sixth transistor, said sixth transistor comprising a sixth transistor first flow electrode, a sixth transistor second flow electrode and a sixth transistor control electrode, said second transistor second flow electrode being coupled to said sixth transistor first flow electrode, said sixth transistor second flow electrode being coupled to a second clocked half-rail differential logic circuit first node, said sixth transistor control electrode being coupled to said fourth transistor first flow electrode and said second clocked half-rail differential logic circuit OUT-BAR terminal;
  a seventh transistor, said seventh transistor comprising a seventh transistor first flow electrode, a seventh transistor second flow electrode and a seventh transistor control electrode, said third transistor second flow electrode being coupled to said seventh transistor first flow electrode, said seventh transistor second flow electrode being coupled to said second clocked half-rail differential logic circuit first node, said seventh transistor control electrode being coupled to said fourth transistor second flow electrode and said second clocked half-rail differential logic circuit OUT terminal;
  an eighth transistor, said eighth transistor comprising an eighth transistor first flow electrode, an eighth transistor second flow electrode and an eighth transistor control electrode, said eighth transistor first flow electrode being coupled to said second clocked half-rail differential logic circuit first node, said eighth transistor second flow electrode being coupled to said second supply voltage, said eighth transistor control electrode being coupled to receive said third clock signal.

7. The cascaded chain of clocked half-rail differential logic circuits of claim 5, wherein;
  said logic block of said first clocked half-rail differential logic circuit and said logic block of said second clocked half-rail differential logic circuit comprise differential logic.

8. The cascaded chain of clocked half-rail differential logic circuits of claim 5, wherein;
  said logic block of said first clocked half-rail differential logic circuit and said logic block of said second clocked half-rail differential logic circuit comprise differential logic gates.

9. The cascaded chain of clocked half-rail differential logic circuits of claim 5, wherein;
  said logic block of said first clocked half-rail differential logic circuit and said logic block of said second clocked half-rail differential logic circuit comprise NMOS pass transistor logic;
  said logic block of said first clocked half-rail differential logic circuit comprises at least one control variable input and at least one pass variable input; and
  said logic block of said second clocked half-rail differential logic circuit comprises at least one control variable input and at least one pass variable input.

10. The cascaded chain of clocked half-rail differential logic circuits of claim 5, wherein;
  said first supply voltage is Vdd and said second supply voltage is ground.

11. The cascaded chain of clocked half-rail differential logic circuits of claim 10, wherein;
  said first transistor, said second transistor, and said third transistor of said first clocked half-rail differential logic circuit and said first transistor, said second transistor, and said third transistor of said second clocked half-rail differential logic circuit are PFETs.

12. The cascaded chain of clocked half-rail differential logic circuits of claim 11, wherein;
  said fourth transistor, said fifth transistor, said sixth transistor, said seventh transistor and said eighth transistor of said first clocked half-rail differential logic circuit and said fourth transistor, said fifth transistor, said sixth transistor, said seventh transistor and said eighth transistor of said second clocked half-rail differential logic circuit are NFETs.

13. A clocked half-rail differential logic circuit comprising:
  a first supply voltage;
  a second supply voltage;
  a clocked half-rail differential logic circuit OUT terminal;
  a clocked half-rail differential logic circuit OUTBAR terminal;
  a first transistor, said first transistor comprising a first transistor first flow electrode, a first transistor second flow electrode and a first transistor control electrode, said first supply voltage being coupled to said first transistor first flow electrode;
  a second transistor, said second transistor comprising a second transistor first flow electrode, a second transistor second flow electrode and a second transistor control electrode, said first transistor second flow electrode being coupled to said second transistor first flow electrode, said second transistor second flow electrode being coupled to said clocked half-rail differential logic circuit OUT terminal;
  a third transistor, said third transistor comprising a third transistor first flow electrode, a third transistor second flow electrode and a third transistor control electrode, said first transistor second flow electrode being coupled to said third transistor first flow electrode, said third transistor second flow electrode being coupled to said clocked half-rail differential logic circuit OUTBAR terminal;
  a fourth transistor, said fourth transistor comprising a fourth transistor first flow electrode, a fourth transistor second flow electrode and a fourth transistor control electrode, said second transistor control electrode being coupled to said fourth transistor first flow electrode and said clocked half-rail differential logic circuit OUT-BAR terminal, said third transistor control electrode being coupled to said fourth transistor second flow electrode and said clocked half-rail differential logic circuit OUT terminal;
  a logic block, said logic block comprising a logic block first input terminal, a logic block second input terminal, a logic block OUT terminal, a logic block OUTBAR terminal and a logic block fifth terminal, said logic block OUT terminal being coupled to said clocked half-rail differential logic circuit OUT terminal, said logic block OUTBAR terminal being coupled to said clocked half-rail differential logic circuit OUTBAR terminal;
  a fifth transistor, said fifth transistor comprising a fifth transistor first flow electrode, a fifth transistor second flow electrode and a fifth transistor control electrode, said fifth transistor first flow electrode being coupled to said logic block fifth terminal, said fifth transistor second flow electrode being coupled to said second supply voltage;

a clocked half-rail differential logic circuit sense amplifier circuit coupled between said clocked half-rail differential logic circuit OUT terminal and said clocked half-rail differential logic circuit OUTBAR terminal, said clocked half-rail differential logic circuit sense amplifier circuit having an input terminal coupled to a second clock signal, wherein;

said second clock signal is delayed with respect to a first clock signal by a predetermined time.

14. The clocked half-rail differential logic circuit of claim 13, wherein;

said clocked half-rail differential logic circuit sense amplifier circuit comprises:

a sixth transistor, said sixth transistor comprising a sixth transistor first flow electrode, a sixth transistor second flow electrode and a sixth transistor control electrode, said second transistor second flow electrode being coupled to said sixth transistor first flow electrode, said sixth transistor second flow electrode being coupled to a clocked half-rail differential logic circuit first node, said sixth transistor control electrode being coupled to said fourth transistor first flow electrode and said clocked half-rail differential logic circuit OUTBAR terminal;

a seventh transistor, said seventh transistor comprising a seventh transistor first flow electrode, a seventh transistor second flow electrode and a seventh transistor control electrode, said third transistor second flow electrode being coupled to said seventh transistor first flow electrode, said seventh transistor second flow electrode being coupled to said clocked half-rail differential logic circuit first node, said seventh transistor control electrode being coupled to said fourth transistor second flow electrode and said clocked half-rail differential logic circuit OUT terminal;

an eighth transistor, said eighth transistor comprising an eighth transistor first flow electrode, an eighth transistor second flow electrode and an eighth transistor control electrode, said eighth transistor first flow electrode being coupled to said clocked half-rail differential logic circuit first node, said eighth transistor second flow electrode being coupled to said second supply voltage, said eighth transistor control electrode being coupled to receive said second clock signal.

15. The clocked half-rail differential logic circuit of claim 14, wherein;

said logic block of said clocked half-rail differential logic circuit comprises differential logic.

16. The clocked half-rail differential logic circuit of claim 14, wherein;

said logic block of said clocked half-rail differential logic circuit comprises differential logic gates.

17. The clocked half-rail differential logic circuit of claim 14, wherein;

said logic block of said clocked half-rail differential logic circuit comprises NMOS pass transistor logic; and said logic block of said clocked half-rail differential logic circuit includes at least one control variable input and at least one pass variable input.

18. The clocked half-rail differential logic circuit of claim 14, wherein;

said first supply voltage is Vdd and said second supply voltage is ground.

19. The clocked half-rail differential logic circuit of claim 18, wherein;

said first transistor, said second transistor, and said third transistor are PFETs.

20. The clocked half-rail differential logic circuit of claim 19, wherein;

said fourth transistor, said fifth transistor, said sixth transistor, said seventh transistor and said eighth transistor are NFETs.

* * * * *